(12) United States Patent
Komatsu et al.

(10) Patent No.: US 7,027,262 B2
(45) Date of Patent: Apr. 11, 2006

(54) SPINDLE MOTOR STRUCTURE MOUNTED DIRECTLY ON A BASE PLATE OF A THIN TYPE FLEXIBLE DISK DRIVE

(75) Inventors: Hisateru Komatsu, Tendo (JP); Makoto Takahashi, Obanazawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 281 days.

(21) Appl. No.: 10/225,365

(22) Filed: Aug. 21, 2002

(65) Prior Publication Data

US 2003/0039060 A1 Feb. 27, 2003

(30) Foreign Application Priority Data

Aug. 22, 2001 (JP) .............................. 2001-251552

(51) Int. Cl.
*G11B 5/016* (2006.01)

(52) U.S. Cl. .................................................. 360/99.04

(58) Field of Classification Search ............. 360/99.04, 360/99.08; 369/266; 310/67 R, 216, 254, 310/256

See application file for complete search history.

(56) References Cited

U.S. PATENT DOCUMENTS

| | | | |
|---|---|---|---|
| 5,400,191 A * | 3/1995 | Sakaguchi et al. ....... | 360/73.03 |
| 5,436,517 A * | 7/1995 | Ogawa ....................... | 310/91 |
| 5,637,945 A * | 6/1997 | Yamamuro et al. ......... | 310/268 |
| 5,789,834 A * | 8/1998 | Katoh et al. .............. | 310/67 R |
| 6,282,053 B1 * | 8/2001 | MacLeod et al. ........ | 360/98.07 |
| 6,476,528 B1 * | 11/2002 | Sekine ..................... | 310/68 B |
| 6,603,635 B1 * | 8/2003 | Suzuki et al. ............ | 360/99.04 |

* cited by examiner

*Primary Examiner*—Angel Castro
(74) *Attorney, Agent, or Firm*—Frishauf, Holtz, Goodman & Chick, P.C.

(57) ABSTRACT

A spindle motor structure includes a solenoid coil 1 provided above a flexible board 2 provided at one face of a base plate of FDD to align in a circumferential direction centering on one axis and a turn table covering the solenoid coil 1 and provided rotatably centering on the one axis. The spindle motor structure can provide FDD capable of achieving a reduction in cost by reducing a number of parts of PWB and the like using a silicon steel plate, i.e. silicon steel plate PWB.

10 Claims, 10 Drawing Sheets

SPINDLE MOTOR STRUCTURE MOUNTED DIRECTLY ON A BASE PLATE OF A THIN TYPE FLEXIBLE DISK DRIVE

BACKGROUND OF THE INVENTION (1) Field of the Invention

The present invention relates to a spindle motor structure, particularly to a structure of a spindle motor used for driving a flexible disk drive (FDD) and a thin type flexible disk drive having the same.

(2) Description of the Related Art

Conventionally, a flexible disk drive (FDD) is used for recording information and reading information to and from a flexible magnetic disk (FD) contained in a case made of plastic.

According to such a conventional FDD structure, there is constituted a structure attached with individual parts with a main frame (chassis) as a base and also with regard to a spindle motor, an assembled product formed with PWB (Power board) as a base, is fixed to a base plate of the main frame by screws.

Therefore, according to a thin type FDD, there is constituted a structure of making a large hole at a central portion of the main frame and a design in consideration of strength of the frame is needed.

Further, the main frame and the PWB mounted with the spindle motor are constituted by separate parts and therefore, a dimensional tolerance is needed which is for ensuring an accuracy of attaching the spindle motor.

SUMMARY OF THE INVENTION

Hence, it is an object of the present invention to provide a spindle motor structure capable of achieving a reduction in cost by reducing a number of parts of PWB and the like using a silicon steel plate.

Further, it is another object of the present invention to provide a spindle motor structure capable of stabilizing the dimension of a main frame.

Further, it is still another object of the present invention to provide a spindle structure capable of increasing rigidity of a frame by deleting a hole for attaching PWB.

Further, it is yet another technical problem of the present invention to provide a spindle motor structure capable of promoting an accuracy of attaching a spindle motor.

Further, it is a further object of the present invention to provide a frame structure having a spindle motor having an advantage similar to that of the spindle motor.

Further, it is a still further object of the present invention to provide a thin type FDD having an advantage similar to that of the spindle motor.

According to an aspect of the present invention, there is provided a spindle motor structure which comprises a solenoid coil provided above a flexible board provided at one face of a base plate of a flexible disk drive to align in a circumferential direction centering on an axis, and a turn table covering the solenoid coil provided rotatably centering on the axis.

Further, according to another aspect of the present invention, there is provided a frame structure having a spindle motor, the spindle motor comprising a base plate of a flexible disk drive, a solenoid coil provided above a flexible board provided at one face of the base plate to align in a circumferential direction centering on one axis, and a turn table covering the solenoid coil and provided rotatably centering on the one axis.

In the frame structure having a spindle motor according to the above-described aspect, the solenoid coil is constituted by arranging a plurality of constitutions arranged at inside of the turn table and provided with wirings at winding frames prolonged in diameter directions centering on the one axis at equal angular intervals and in a shape of a concentric circle.

Further, according to still another aspect of the present invention, there is provided a thin type flexible disk drive which comprises a main frame, a containing and discharging mechanism contained at inside of the main frame for containing and discharging a cartridge contained with a flexible disk, a spindle motor provide at the main frame for rotating the flexible disk centering on one axis, and a head assembly movable in a radius direction of the flexible disk. The spindle motor comprises a flexible board arranged above one face of the frame and including a plurality of solenoid coils arranged at a surrounding of the one axis, and a turn table provided rotatably at the surrounding of the one axis to cover the solenoid coils. The flexible board is electrically connected to a main circuit board provided at the one face of the main frame for driving the flexible disk drive.

DESCRIPTION OF THE PREFERRED EMBODIMENTS

Before explaining embodiments of the present invention, in order to facilitate to understand the present invention, an explanation will be made as regards FDD according to a related art with reference to FIGS. 1 through 6.

Figure 1:
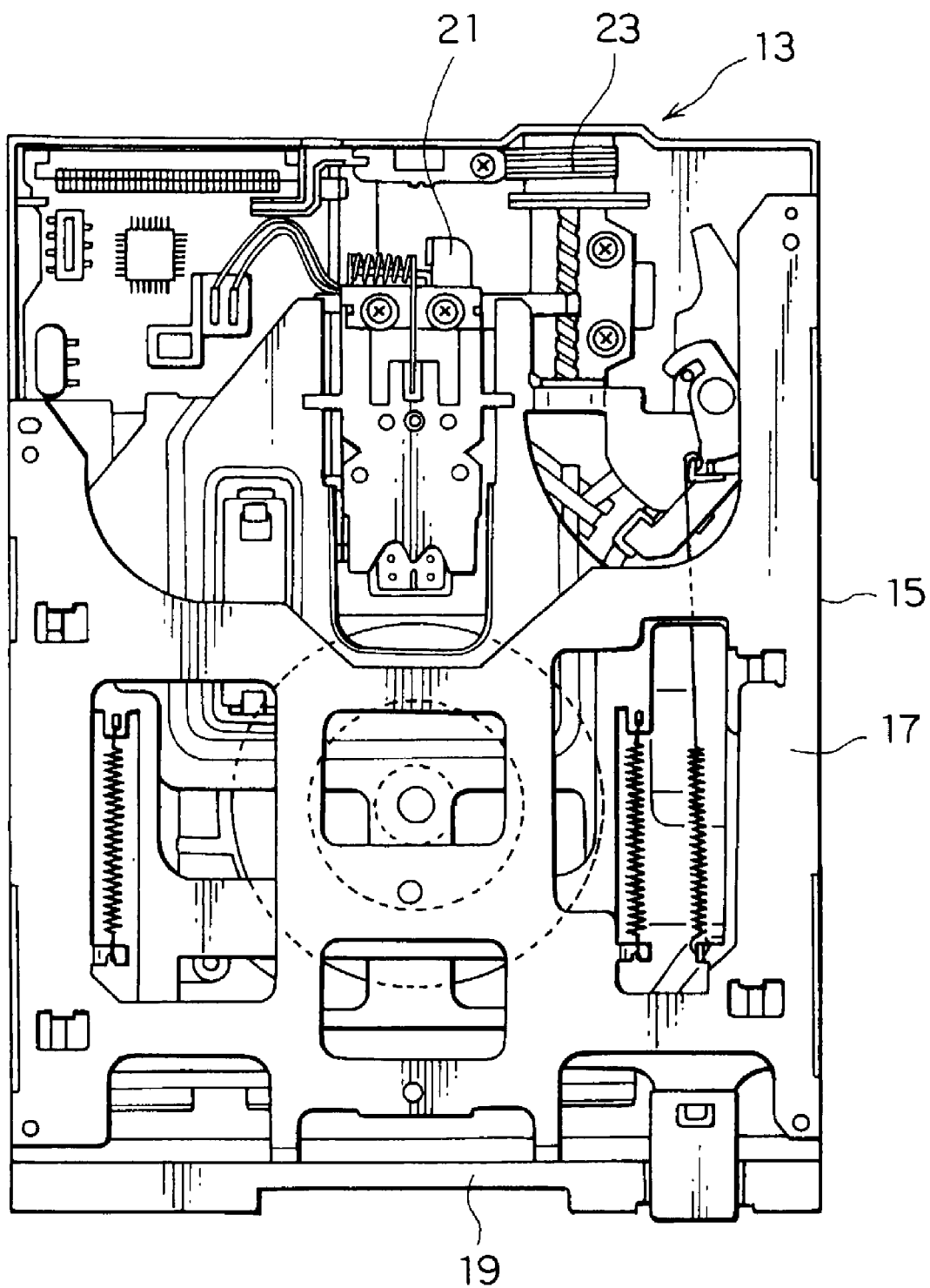
FIG. 1 is a plan view of FDD according to a related art removed of a cover thereof.

Referring to FIG. 1, FDD 13 is provided with a main frame 15, a disk containing and discharging mechanism 17, a front bezel 19, a head assembly 21, and a screw type stepping motor 23. The main frame 15 is constituted by a box type shape in which an upper portion thereof having an opening on one end side is opened. The disk containing and discharging mechanism 17 is provided to cover the upper portion of the main frame 15. The front bezel is provided on the one end side of the main frame 15 to constitute a lid of an opening for containing FD. The head assembly is provided on a rear end side of the main frame 15 and is constituted progressably and regressably in a front and rear direction, which will be shown as up and down direction in the drawing. The stepping motor 23 drives the head assembly.

Figure 2:
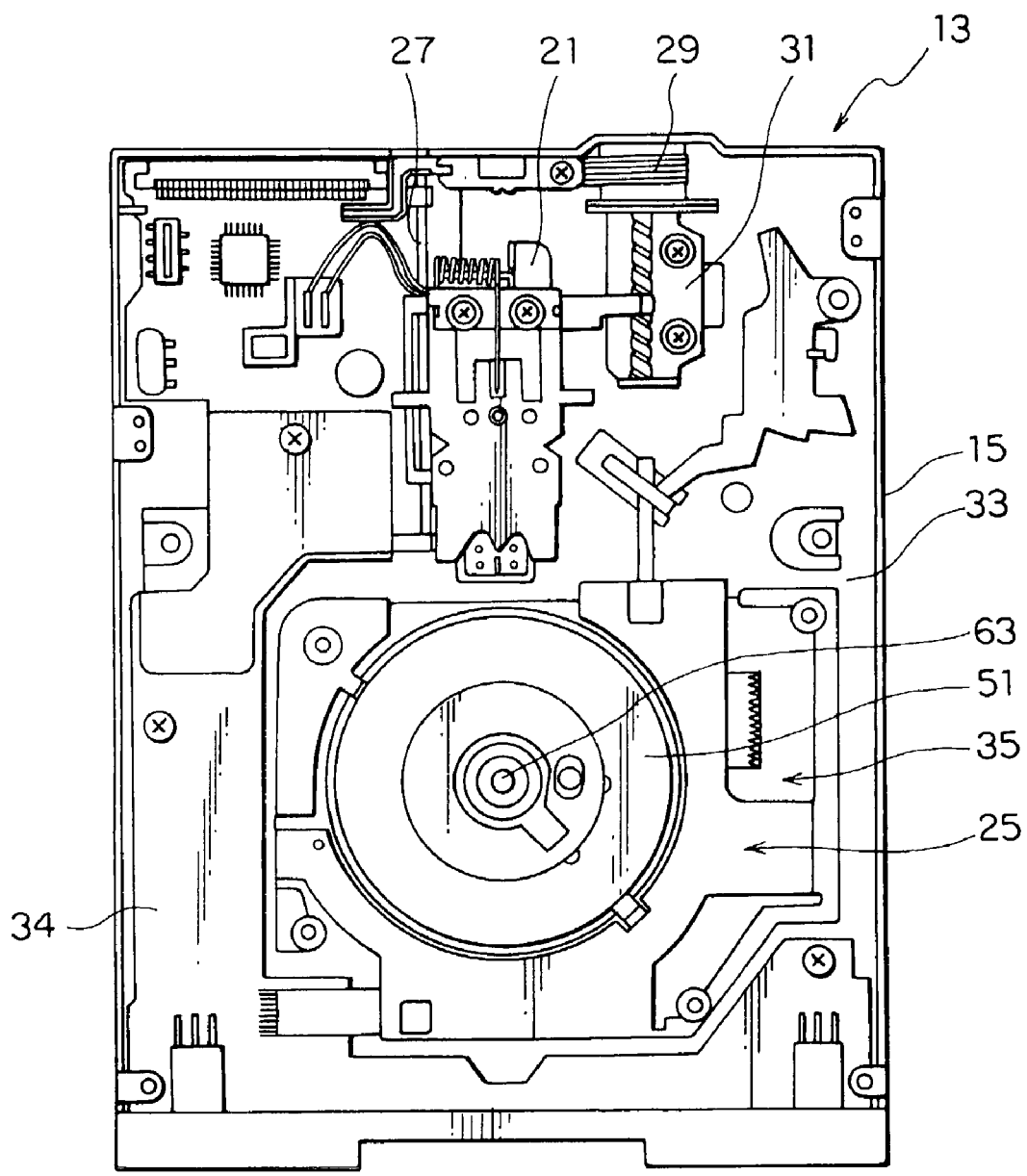
FIG. 2 is a plan view of FDD of FIG. 1 removed of a disk containing and discharging mechanism comprising an eject plate and a disk holder.

Referring to FIG. 2, the main frame 15 is provided with a PWB containing portion or attaching portion 35 having a circular through hole portion at a center thereof in order to attach PWB 25 formed on a silicon steel plate to a base plate 33 constituting a bottom portion. PWB 25 is attached to the attaching portion 35 from an outer side by screws or the like. The head assembly 21 is provided on one side of the main frame 15. The head assembly 21 is constituted by a channel-like shape in a vertical section thereof and magnetic heads, not illustrated, are respectively provided on inner side faces thereof opposed to each other. The head assembly 21 is provided to carry out progressing and regressing movement in the front and rear direction constrained by being guided by a guide rail 27 provided on one side thereof. Further, a stepping motor 29 is provided on a side opposed to the one side of the head assembly 21 via an attaching metal piece 31. The head assembly 21 is provided with an engaging portion engaged with a groove in a spiral shape provided at a screw rod of the stepping motor 29. By driving the stepping motor 29, the screw rod is rotated. In accordance with rotation of the screw rod, the head assembly 21 has the engaging portion engaged with the groove of the screw rod so as to be moved in the front and rear direction. Further, a main board 34 having an L-like shape is provided on one face of the base plate 33 of the main frame 21.

Figure 3A:
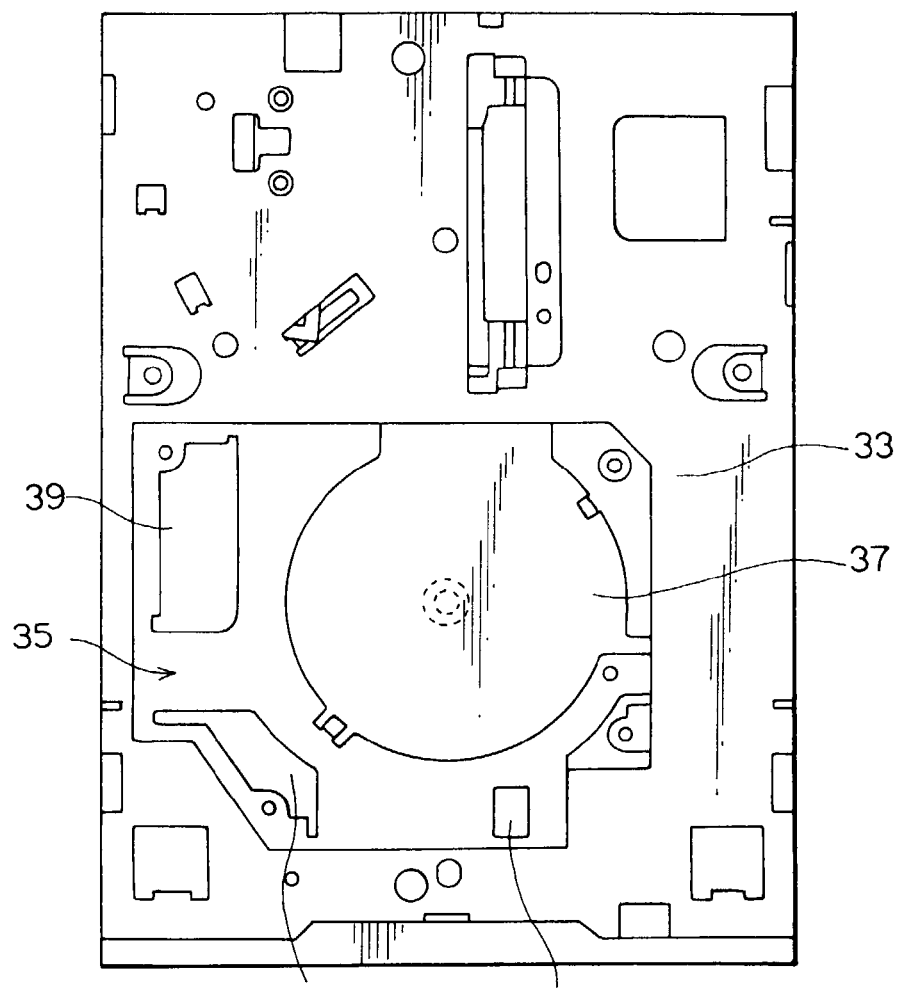
FIGS. 3A and 3B illustrates bottom views of FDD according to the related art and are views viewing FDD by removing PWB portion having a spindle motor.
Figure 3B:
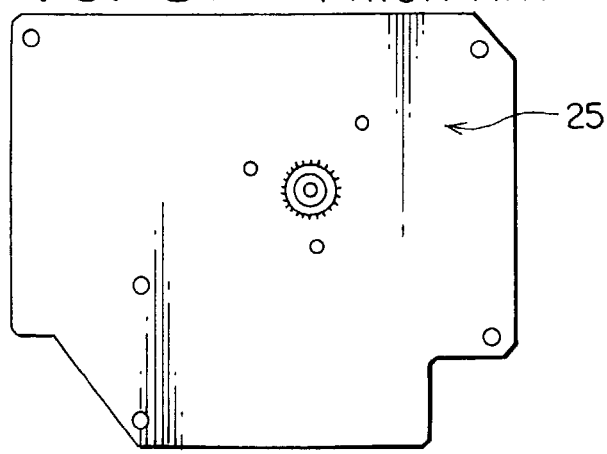

Referring to FIG. 3A, the base plate 33 of the main frame 21 is provided with the PWB containing portion 35 recessed in a circular shape to contain PWB 25 as shown in FIG. 3B. The PWB containing portion 35 is provided with a circular hole portion 37 in correspondence with a shape of a turn table of the spindle motor. The spindle motor has the turn table and notched portions 39, 41, 43 penetrating the plate face at surroundings of the hole portion 37. The PWB containing portion 35 is recessed to be concave to an inner side centering on the circular hole portion 37.

Figure 4:
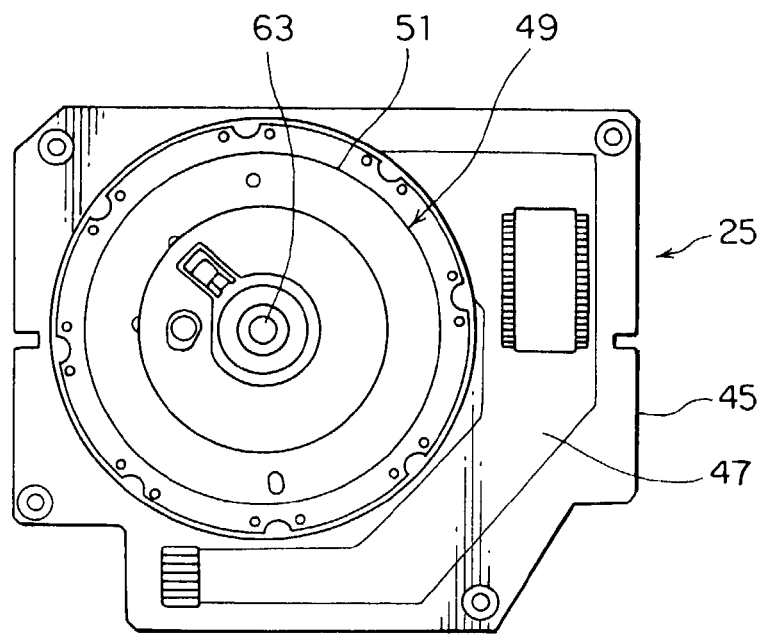
FIG. 4 is a plan view of PWB of FIG. 3.

As shown in FIG. 4, PWB 25 is provided with a silicon steel plate 45, a wiring pattern 47, and a spindle motor portion 49. The wiring pattern 47 is provided above the silicon steel plate 45 via resin or the like (not illustrated) comprising an insulating material, further, a surface thereof is covered with similar resin (not illustrated). A turn table 51 is rotatably provided to constitute the spindle motor portion 49.

Figure 5:
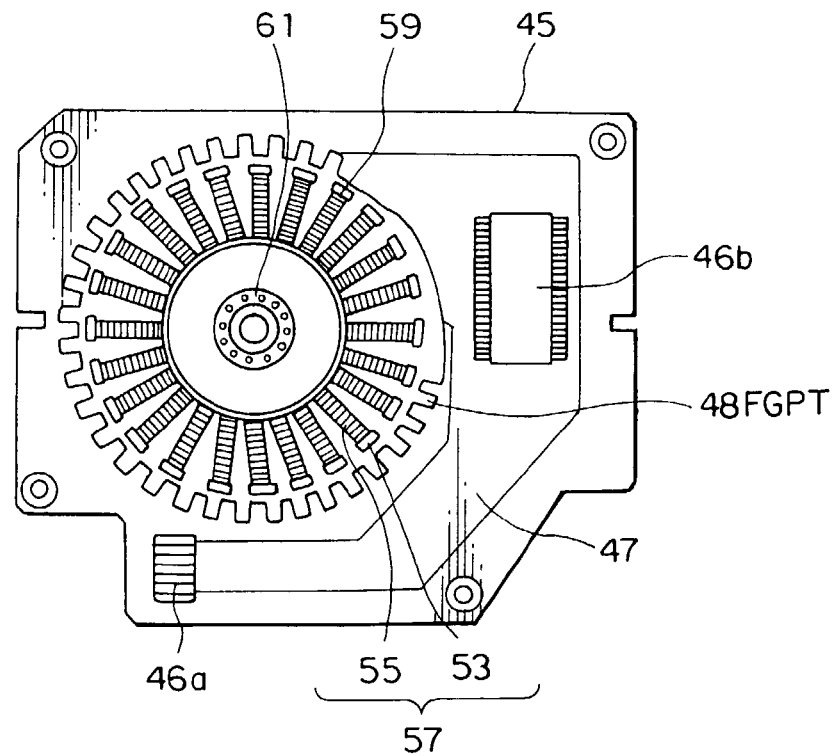
FIG. 5 is a plan view of PWB of FIG. 4 removed of a turn table.

As shown in FIG. 5, an exciting coil 59 is provided above the pattern when the turn table 51 is removed. The exciting coil 59 is formed by aligning 24 pieces of solenoid coils 57 each constituted by winding a winding 55 around a coil bobbin 53, along a circumference at equal angular intervals. Further, at a central portion thereof, there is provided a rotary or thrust bearing 61 in correspondence with a rotating shaft 63. Further, notation 46a designates a soldered terminal portion and notation 46b designates an electronic part mounted to a wiring pattern 47.

Figure 6:
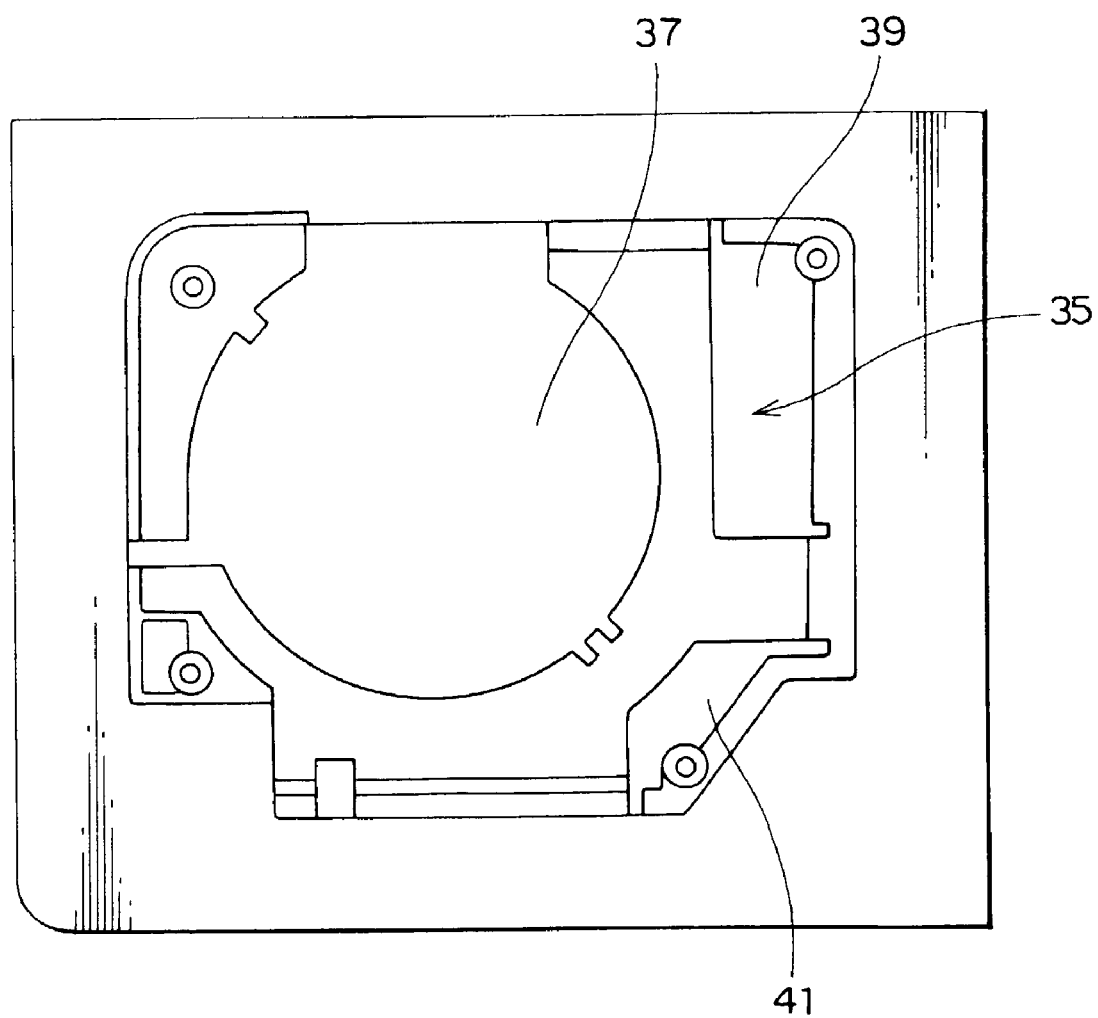
FIG. 6 is a bottom view of a portion of attaching PWB of a main frame.

As shown in FIG. 6, when PWB 25 is inserted into the containing portion 35 having the recessed bottom portion and attached thereto by screws, the spindle motor structure as shown in FIG. 2 is finished.

Now, an explanation will be made as regards an embodiment of the invention in reference to FIGS. 7 through 11.

Figure 7:
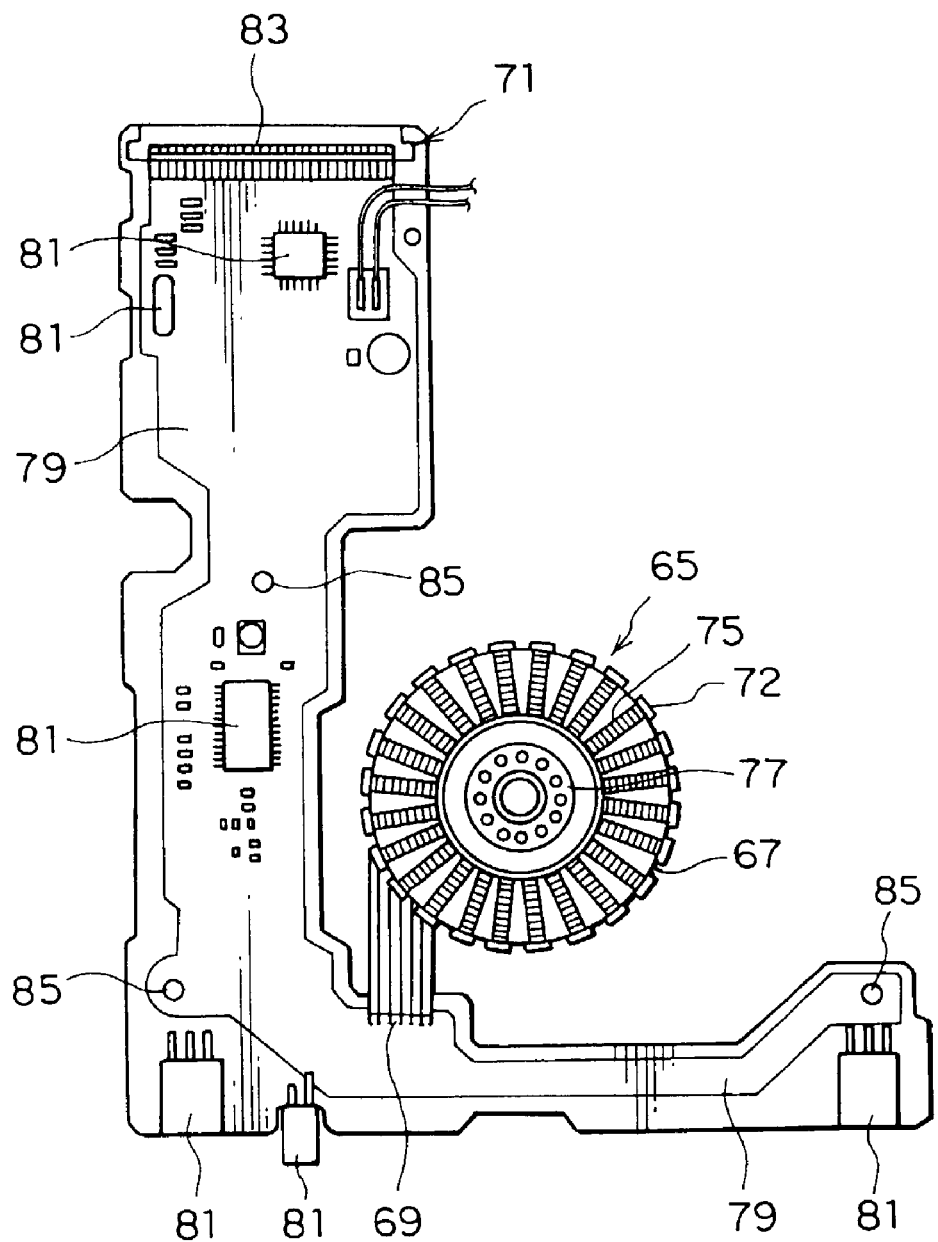
FIG. 7 is a plan view showing a solenoid coil board and a main circuit board of a spindle motor according to an embodiment of the present invention.

As shown by FIG. 7, a drive board of an FDD spindle motor is provided with a flexible board 67 and a main board 71. The flexible board 67 is formed with a solenoid coil 65. The main board 71 is provided with a soldered connecting end portion 69 connected to the flexible board 67.

The solenoid coil 65 is formed by providing windings 75 to winding frames 72 projected to outer sides in radius directions. The solenoid coil 65 is formed by being integrally formed with one face of the flexible board 67 or adhered to the one face. Although in the illustrated example, a bearing 77 is mounted to a center thereof, the bearing 77 can be removed.

Further, the main board 71 is provided with an L-like shape. The main board 71 is connected with the flexible board 67 via the soldered connecting portion 69. Various electronic parts 81 are provided which are connected via a circuit pattern 79 above the main board 71. Further, a connector 83 is provided for electrically connecting to outside at one end of the main board 71. Further, a screw hole 85 is provided for fixing the main board 71 to a base plate of a main frame, mentioned later, at the main board 71.

Figure 8:
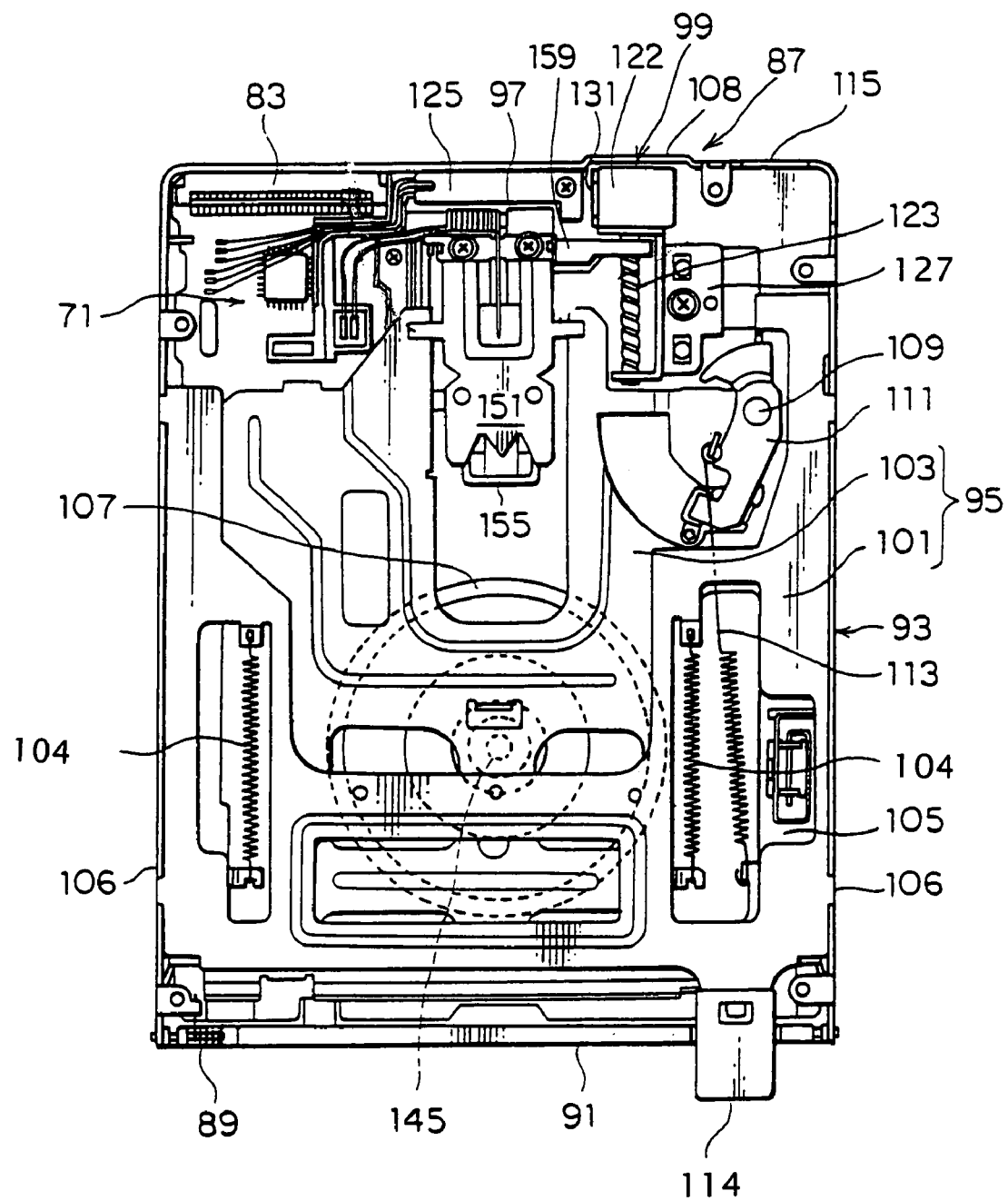
FIG. 8 is a plan view of a flexible disk drive according to an embodiment of the present invention removed of a cover thereof.

Referring to FIG. 8, FDD 87 is provided with a main frame 93, a disk containing and discharging mechanism 95 contained in the main frame 93, a head assembly 97 progressable and regressable in an up and down direction in FIG. 8, and a stepping motor 99.

The main frame 93 is provided with a base plate 105, a side plate 106, and a rear plate 108. The main frame 93 is provided openably and closably with an upper end portion thereof as an axis and is provided with a front bezel 91 urged to cover an opening by a spring 89 at one end thereof. The disk containing and discharging mechanism 95 is contained in the main frame 93. The head assembly 97 is provided progressably and regressably in the up and down direction in FIG. 8. The stepping motor 99 is provided to move to position the head assembly 97.

The disk containing and discharging mechanism 95 is provided with an eject plate 101 and a disk holder 103 provided on an inner side thereof. A cartridge containing a flexible magnetic disk is contained in a space between the disk holder 103 and the base plate 105 of the main frame 93 and above a turn table 107. Further, the eject plate 101 and the disk holder 103 are provided to overlap. The eject plate 101 is urged in a front direction, which will be shown in a lower direction in the drawing, relative to the disk holder 103 by coil springs 104 provided on both sides of the eject plate 101. Further, at one end of the disk holder 103, there is provided a push lever 111 rotatable centering on a shaft 109. A coil spring 113 is provided between the push lever 111 and the disk holder 103.

When the cartridge of the flexible magnetic disk is contained, one end portion of the disk cartridge is brought into contact with one end of the lever 111 and the lever 111 is rotated in the clockwise direction centering on the shaft 109. When the lever 111 is rotated up to a predetermined position, the lever 111 is stopped by engaging with the disk holder 103.

Meanwhile, in ejecting the disk cartridge, when an eject button 114 is depressed, for example, an upward direction in the drawing, the engagement between the lever 111 and the disk holder 103 is disengaged, and by recovering force of the coil spring 113, the lever 111 is rotated in the counterclockwise direction to thereby push out the disk cartridge.

Figure 9:
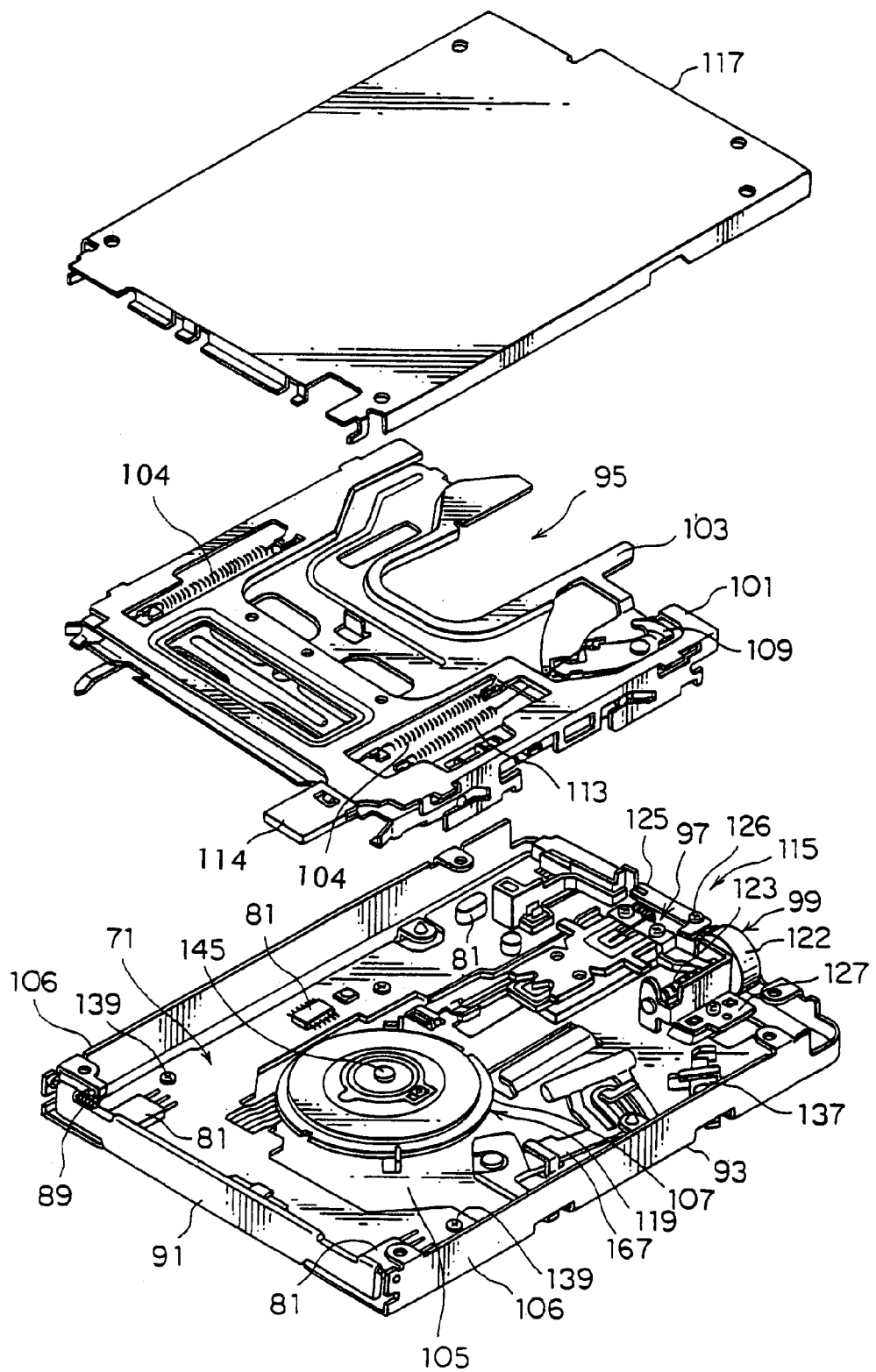
FIG. 9 is a disassembled perspective view of a flexible disk drive according to an embodiment of the present invention.

In reference to FIG. 9, FDD 87 is constituted by providing an essential portion 115, the disk containing and discharging mechanism 95 contained in the essential portion 115 and a cover 117 for covering an upper portion thereof.

Figure 10:
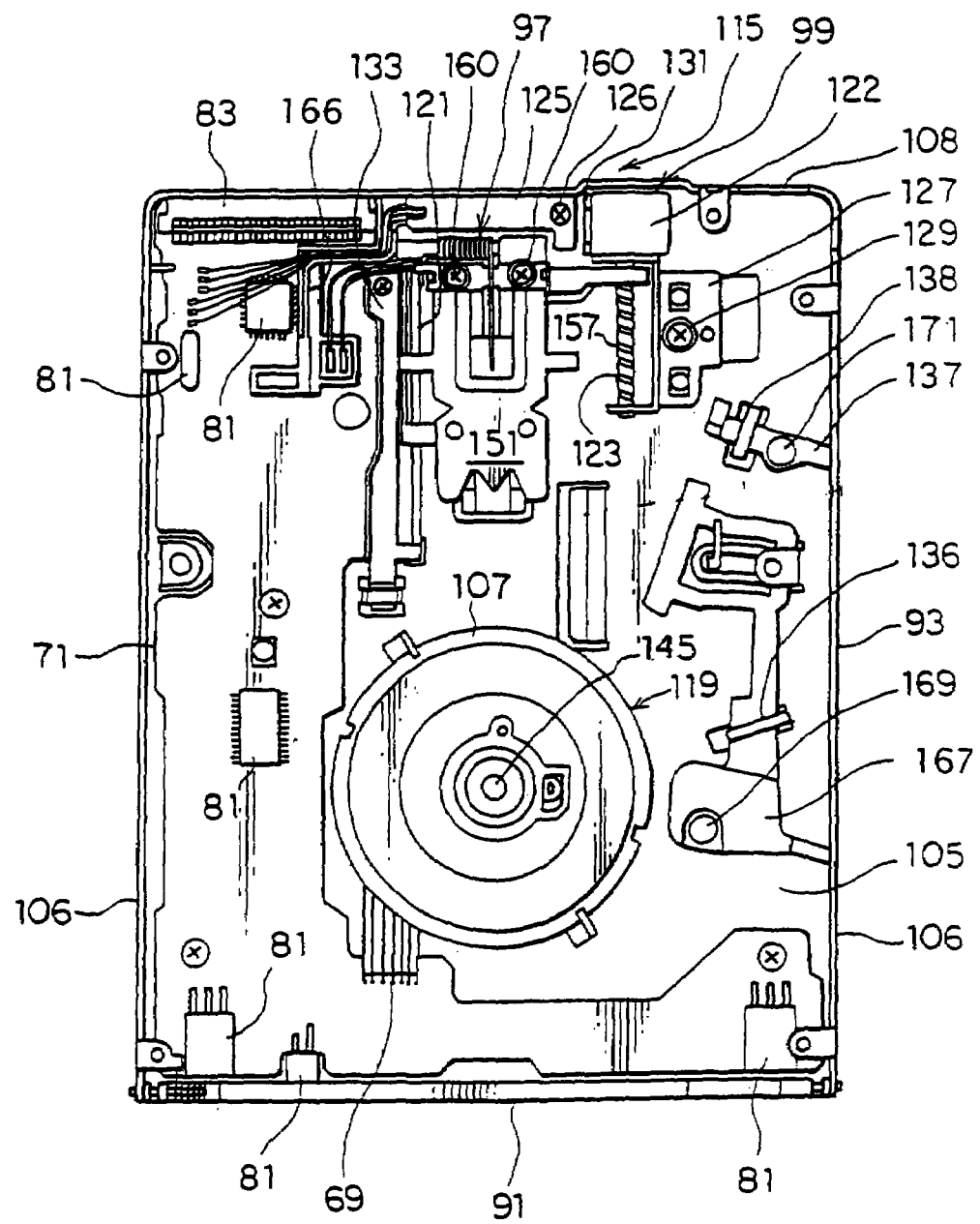
FIG. 10 is a disassembled perspective view of an essential portion of a flexible disk drive according to an embodiment of the present invention removed of an upper cover thereof.
Figure 11:
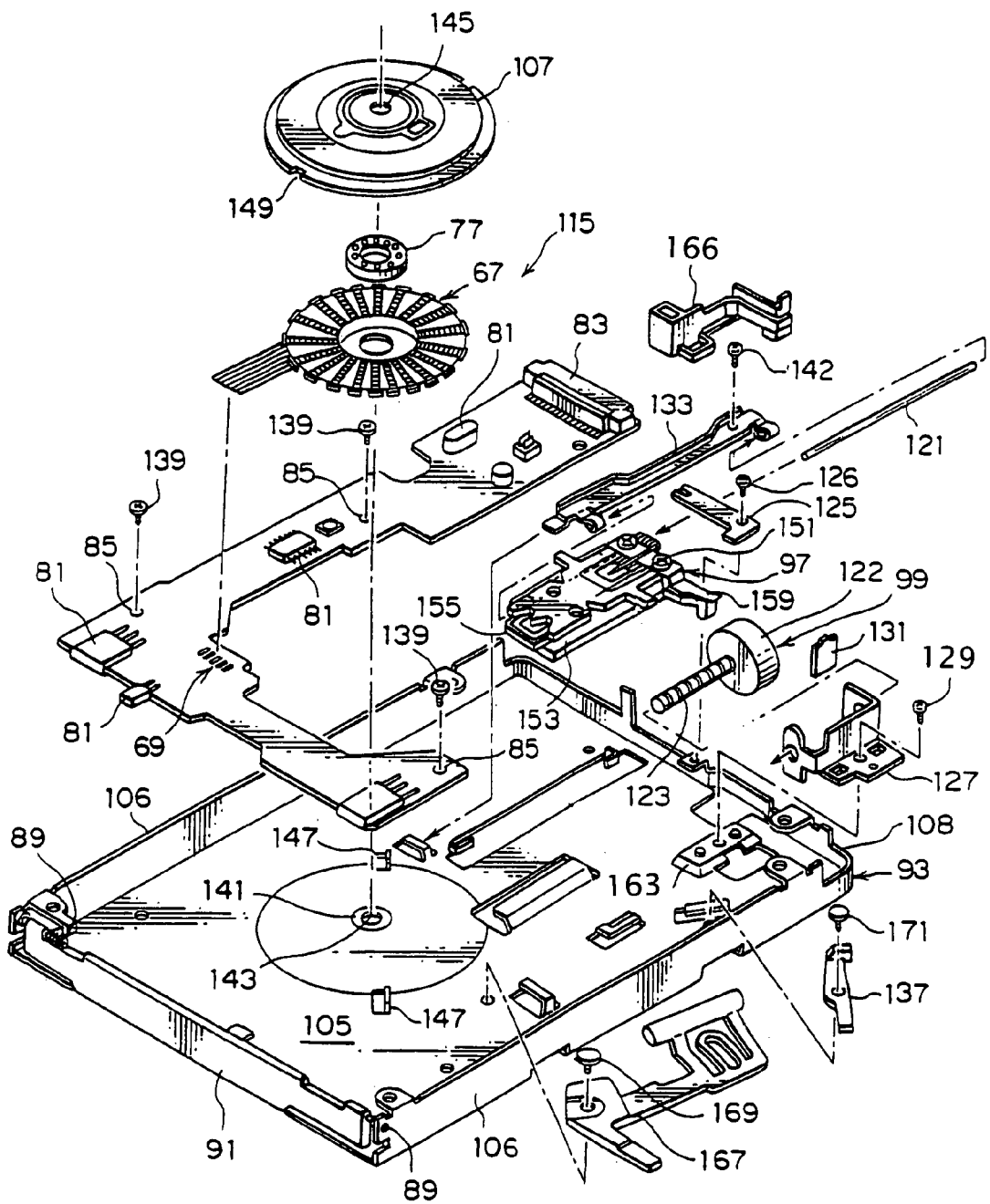
FIG. 11 is a disassembled perspective view of an essential portion of the flexible disk drive of FIG. 10.

In reference to FIG. 10 and FIG. 11, the principal portion 115 of FDD 87 is provided with the main frame 93, a spindle motor 119 provided above the base plate 105 of the main frame 93, and the main board 71 provided above the base plate 105 at a surrounding of the spindle motor 119.

Above the main board 71, there is provided a reinforcing portion made of synthetic resin also serving as a guide for a flexible cable for signal from the head assembly 97. The reinforcing portion is used to maintain strength against compression in the up and down direction. The head assembly 97 is provided at one end of the base plate 105 of the main frame 93. One side of the head assembly 97 is inserted into a guide rail 121. Further, the other side of the head assembly 97 is engaged with a groove portion of a drive rod 123 extended from a main body 122 of a step motor 99.

A rear side of the head assembly 97 is fixed with a board 125 for electric connection by a screw 126. The spindle motor 99 is provided at one side portion of the head assembly 97. The spindle motor 99 is fixed to position by fastening a metal piece 127 by a screw 129. Further, a circuit board 131 for supplying current is provided also on one side of the spindle motor 99. Further, also the guide rail 121 is fixed to the base plate 105 along with the main board 71 by a metal piece 133.

Further, an upper face of the base plate 105 is provided with a push up lever 167 for pushing up the disk cartridge in cooperation with the eject plate 103 (refer to FIG. 9), an eject lever 109 and a lock releasing lever 137 for disengaging engagement with the disk holder 103. Further, notations 136 and 138 designate cut pieces for preventing rise of level of the push up lever 167 and lock releasing lever 137.

Referring to FIG. 11, in order to assemble the essential portion 115, the main board 71 is fixed to the base plate 105 of the main frame 93 by a screw 139. The attaching metal piece 133 is provided by a screw 142 to hold an inner side of a rear end of the main board 71. The attaching metal piece 133 serves also as a fixing metal piece of the guide rail 121 of the head assembly 97.

Next, the flexible board 67 formed with the solenoid coil 65 (FIG. 7) is mounted to a bottom portion of the base plate 105 of the main frame 93 by aligning to a through hole 143 having a bearing 141. The bearing 77 is provided above the center of the flexible board 67. Further, a rotating shaft 145 of the turn table 107 is rotatably contained in the through hole via the bearing 141. Here, the turn table 107 is mounted by aligning positions of a cut-up portion 147 provided at the base plate 105 and a groove 149 of the turn table 107, and once the turn table 107 is mounted, the turn table 107 is rotatable. However, detachment of the turn table 107 to an upper side is hampered so far as rotational positions of the groove 149 and the cut-up portion 147 do not coincide with each other.

The head assembly 97 is constituted by a channel-like shape in a vertical section thereof and magnetic head elements 155 are respectively provided on inner sides of upper and lower head support pieces 151 and 153. One side of the head assembly 97 is provided with the step motor 99 having a drive rod 123 projected to one end. The step motor 99 is fixed by fixing a metal piece 127 to a projected portion 163 provided at the base plate by a screw 165 such that an engaging portion 159 at one end of the head assembly 97 is engaged with a groove 157 provided at a screw rod 123 for driving of the step motor 99.

Further, a member 166 in an S-like shape is made of plastic and is provided for guiding a cable for connecting the head assembly 97 and the main board 71 and reinforcing FDD.

Further, a push up lever 167 is provided rotatably around pin 169 for pushing up the contained flexible disk cartridge in an upper front direction in cooperation with the eject plate 101 (FIG. 9) in ejecting the disk cartridge. And the lock releasing lever 137 is provided rotatably around pin 171 for lifting the disk holder 103 and disengaging engagement in the front and rear direction of the eject plate and the disk holder 103.

As shown in FIG. 11, when the essential portion 115 is assembled, as shown in the plan view of FIG. 10, the essential portion 115 is completed.

Further, when the disk containing and discharging mechanism 95 is mounted onto the essential portion 115 as shown by FIG. 9, there is constructed the structure shown in FIG. 8. Further, by mounting the cover 117 as shown in FIG. 9, the disk drive is finished.

In this way, according to the embodiment of the present invention, by directly attaching the spindle motor 119 to the base plate 105 of the main frame 93 without using PWB formed above the silicon steel plate, in accordance with a change in the spindle motor structure (FG sensorless), the circuit constitution of the spindle motor PWB is simplified, the constitution can deal therewith only by the flexible board (FPC) 67 without using PWB using the silicon steel plate separately constituted conventionally and the flexible disk drive can be constructed by a thin type and simple constitution.

Further, according to the embodiment of the present invention, the base plate 105 of the main frame 93 is dispensed with a shape of attaching an assembled product of the spindle motor 119, for example, a hole, the accuracy of the attaching position can be promoted and the fabrication can further be facilitated.

As has been explained above, according to the present invention, FDD can be provided which is capable of achieving a reduction in cost by reducing a number of parts of PWR or the like using the silicon steel plate.

Further, according to the present invention, FDD can be provided which is capable of stabilizing dimensions of the main frame.

Further, according to the present invention, FDD can be provided which is capable of strengthening the rigidity of the frame by deleting a hole of the main frame for attaching PWB.

Further, according to the present invention, FDD can be provided which is capable of promoting the accuracy of attaching the spindle motor by directly attaching the spindle motor to the main frame.

What is claimed is:

1. A spindle motor structure comprising:
   a base plate of a main frame of the flexible disk drive, said base plate comprising a cut-up portion;
   a solenoid coil which is provided above a flexible board provided on the base plate and which is centered on an axis; and
   a turn table covering the solenoid coil and provided rotatably centering on the axis;
   wherein the turn table comprises a groove and is mounted by aligning positions of the groove and the cut-up portion.

2. The spindle motor structure according to claim 1, wherein the turn table has a cap shape, and a rotating shaft extends through the turn table along the axis.

3. The spindle motor structure according to claim 2, wherein the solenoid coil comprises a plurality of elements arranged inside of the turn table and each including a winding around a winding frame, wherein the elements extend diametrically from the axis at equal angular intervals so as to define a circle centering on the axis.

4. The spindle motor structure according to claim 3, wherein the solenoid coil and the flexible board are integrally formed ma circular disk shape, and an extended portion having a strip-like shape and a plurality of extensions extends from the circular disk shape.

5. A frame structure including a spindle motor, said structure comprising:
   a base plate of a main frame of a flexible disk drive, said base elate comprising a cut-up portion;
   a solenoid coil provided above a flexible board provided on the base plate to align in a circumferential direction centering on one axis; and
   a turn table covering the solenoid coil and provided rotatably centering on the one axis;
   wherein the turn table comprises a groove and is mounted by aligning positions of the groove and the cut-up portion.

6. The frame structure according to claim 5, wherein the solenoid coil comprises a plurality of elements arranged inside of the turn table and each including a winding around a winding frame, wherein the elements extend diametrically from the axis at equal angular intervals so as to define a circle centering on the axis.

7. The frame structure according to claim 6, wherein the solenoid coil and the flexible board are integrally formed in a circular disk shape, and an extended portion having a strip-like shape and a plurality of extensions extends from the circular disk shape.

8. A thin flexible disk drive comprising:
   a main frame comprising a base elate which includes a cut-up portion;
   a containing and discharging mechanism contained inside of the main frame for containing and discharging a cartridge containing a flexible disk;
   a spindle motor provided on the base plate of the main frame for rotating the flexible disk centering on an axis; and
   a head assembly movable in a radial direction of the flexible disk,
   wherein the spindle motor comprises:
      a flexible board provided on the base plate of the main frame and including a plurality of solenoid coils surrounding the axis; and
      a turn table provided rotatably around the axis so as to cover the solenoid coils,
      wherein the flexible board is electrically connected to a main circuit board provided on the base plate of the main frame for driving the flexible disk drive; and
   wherein the turn table comprises a groove and is mounted by aligning positions of the groove and the cut-up portion, and once the turn table is mounted, the turn table is rotatable and upward detachment thereof is inhibited as long as the positions of the groove and the cut-up portion do not coincide.

9. The thin type flexible disk drive according to claim 8, wherein the solenoid coils are arranged inside of the turn table, and each of the solenoid coils comprises an element including a winding around a winding frame extending diametrically from the axis such that the solenoid coils are provided at equal angular intervals and define a circle centered on the axis.

10. The thin type flexible disk drive according to claim 9, wherein the solenoid coil and the flexible board are integrally formed in a circular disk shape, and an extended portion having a strip-like shape and a plurality of extensions extends from the circular disk shape.

* * * * *